United States Patent
Ohta et al.

[11] Patent Number: 5,557,205
[45] Date of Patent: Sep. 17, 1996

[54] MAGNETIC FIELD GENERATING APPARATUS FOR USE IN MRI

[75] Inventors: Kimiharu Ohta, Takatsuki; Masaaki Aoki, Amagasaki, both of Japan

[73] Assignee: Sumitomo Special Metals Co., Ltd., Osaka, Japan

[21] Appl. No.: 355,163

[22] Filed: Dec. 8, 1994

[30]    Foreign Application Priority Data

Dec. 27, 1993   [JP]   Japan .................................. 5-350289

[51] Int. Cl.$^6$ ........................................................ G01V 3/00
[52] U.S. Cl. ............................................ 324/319; 335/304
[58] Field of Search .................................... 324/319, 320, 324/318, 322, 300, 307; 335/304, 306

[56] References Cited

U.S. PATENT DOCUMENTS 4,695,802   9/1987   Zijlstra ..................................... 324/319

Primary Examiner—Louis M. Arana
Attorney, Agent, or Firm—Watson Cole Stevens Davis, PLLC

[57] ABSTRACT

In a magnetic field generating apparatus for use in MRI comprising cylindrical yokes, a pair of permanent magnets of a trapezoidal section opposed in parallel with each other in the cylindrical yokes with a predetermined gap being defined between each of the pole faces of them, permanent magnets of a triangular section in adjacent with both sides of the trapezoidal permanent magnet in which a magnetic field space having a hexagonal cross section in perpendicular to the longitudinal direction defined by pole faces of the trapezoidal permanent magnets and the pole faces of the triangular permanent magnets, wherein the trapezoidal permanent magnets comprise rare earth system permanent magnet and the direction of magnetization thereof is identical with the direction of the magnetic field in the magnetic field space, the triangular permanent magnets comprise a ferrite system permanent magnet and the direction of magnetization thereof is at a 90° direction relative to the counterface to the magnetic field space, and an extreme end at a yoke abutting face of the trapezoidal permanent magnet corresponds with an extreme end at yoke abutting face of the triangular permanent magnet.

18 Claims, 6 Drawing Sheets 5,557,205

MAGNETIC FIELD GENERATING APPARATUS FOR USE IN MRI

BACKGROUND OF THE INVENTION

1. Field of the Invention

The present invention relates to an improvement of magnetic field generating apparatus for use in a magnetic resonance imaging apparatus (hereinafter referred to as MRI) for medical treatment use and the like and, more in particular, it relates to an MRI magnetic field generating apparatus having an enhanced magnetic efficiency, decreased in the size of the magnetic field generating apparatus and capable of attaining a reduced cost by optimizing the material and the arrangement of permanent magnets as a magnetic field generating source.

2. Description of the Related Art

MRI is an apparatus for obtaining tomographic images of an object by inserting a person to be diagnosed in a magnetic space of a magnetic field generating apparatus that forms a strong magnetic field, and constitution using permanent magnets as magnetic field generating sources as shown in FIG. 7 and FIG. 8 have been known.

In the MRI magnetic field generating apparatus shown in FIG. 7, a pair of permanent magnets 2a, 2b each of a trapezoidal section are opposed in parallel with each other in hexagonal cylindrical yokes 1 with a predetermined gap being defined between each of pole faces of them, and permanent magnets 3a, 3b, 3c, 3d each of a triangular section are disposed in adjacent with both sides of the trapezoidal permanent magnets 2a, 2b, such that a magnetic space 4 having a hexagonal section in the direction perpendicular to the longitudinal direction is defined by the pole faces of the trapezoidal permanent magnets 2a, 2b and the pole faces of the triangular permanent magnets 3a, 3b, 3c, 3d, thereby forming a magnetic field in the direction Y of the drawing in the magnetic field space (refer to Japanese Patent Laid Open Hei 5-287047).

In this constitution, for forming the magnetic field in predetermined direction, the trapezoidal permanent magnets 2a, 2b each of the trapezoidal section have directions of magnetization identical with the direction of magnetic field in the space, while the permanent magnets 3a, 3b, 3c, 3d each of the triangular section have directions of magnetization at a 90° direction (perpendicular direction) relative to the direction of magnetic field in the space, and a rare earth type permanent magnet having a large maximum energy product ((BH)max) such as an Fe—B—R type permanent magnet has been used for each of the permanent magnets with an aim of reducing the size and the weight.

Further, for improving the uniformity of the magnetic field in the magnetic field space 4 in the MRI magnetic field generating apparatus having the foregoing constitution. It has also been proposed a constitution in which pole pieces each made of a predetermined material and having a predetermined shape (not illustrated) are disposed on the counterfaces of a pair of permanent magnets 2a, 2b each of the trapezoidal section to the magnetic space 4 (Japanese Patent Laid Open Hei 5-291026).

In the MRI magnetic field generating apparatus shown in FIG. 8, a pair of plate yokes 11a, 11b are opposed to each other by way of a plurality (usually four) of post yokes 13 so as to define a predetermined magnetic field space 12 and permanent magnetic 14a, 14b are disposed on the counterfaces of the plate yokes 11a, 11b to the magnetic field space 12 to define a magnetic field in the direction Y of the drawing in the magnetic field space 12. In the drawing, pole pieces 17 are disposed with an aim of further improving the uniformity of the magnetic field in the magnetic field space 12.

The illustrated constitution shows magnetic field generating apparatus having an enhanced magnetic efficiency, decreased in the size and capable of attaining reduced cost by coaxially arranging rare earth system permanent magnets 15a, 15b having a large maximum energy product ((BH)max) such as Fe—B—R system permanent magnets and ferrite system permanent magnets 16a, 16b having a smaller maximum energy product ((BH)max) than that of the rare earth system permanent magnets 15a, 15b but of greatly reduced cost (Japanese Utility Model Publications Hei 3-14011 and Hei 3-14012).

In the constitution described above, each of the magnetization for the rare earth permanent magnets 15a, 15b and the ferrite permanent magnet 16a, 16b has the identical direction with that of the magnetic field in the magnetic field space 12.

Descriptions have been made to the constitution of typical magnetic field generating apparatus using permanent magnets as the magnetic field generating source. For attaining the generalized use of the MRI magnetic field generating apparatus, it has been demanded for further decreasing in the size and the weight and reducing the cost, and an improvement has been made recently for the magnetic field generating apparatus of a constitution shown in FIG. 7 with a view point, for example, of less magnetic leakage and higher magnet efficiency as compared with the constitution shown in FIG. 8.

However, for the magnetic field generating apparatus of the constitution shown in FIG. 7, consideration has been given only to the constitution having only the rare earth system permanent magnets of a large maximum energy product ((BH)max) as explained previously and not to an arrangement combined with inexpensive permanent magnets such as ferrite system permanent magnets as in the constitution of the magnetic field generating apparatus shown in FIG. 8.

Since the magnetic field generating apparatus of the constitution shown in FIG. 7 and the magnetic field generating apparatus of the constitution shown in FIG. 8 are different from each other in the basic technical concept regarding the magnetic path, no aimed magnetic field of a high uniformity can be obtained in the magnetic field space, by merely replacing the rare earth system permanent magnets with the ferrite system permanent magnets in one of the permanent magnets 2a, 2b each of the trapezoidal sections and the permanent magnets 3a, 3b, 3c, 3d each of the triangular sections, which only results in increased size of the apparatus.

OBJECT OF THE INVENTION

It is an object of the present invention to overcome the foregoing problem and provide a magnetic field generating apparatus for use in MRI having an enhanced magnetic efficiency, decreased in the size of the magnetic field generating apparatus and capable of attaining a reduced cost, by effectively arranging permanent magnets made of different materials such as rare earth system permanents magnet and ferrite system permanent magnets of different maximum energy products ((BH)max) in an MRI magnetic field generating apparatus having a magnetic field space of a hexagonal cross section formed by being surrounded with pole faces of a plurality of permanent magnets.

The inventors of the present application have made various experiments for attaining the foregoing object and, as a result, found that the conditions for the arrangement of each of the permanent magnets are different depending on the directions of magnetization of the rare earth system permanent magnets and the ferrite system permanent magnets relative to the direction of the magnetic field in the magnetic field space formed in the MRI magnetic field generating apparatus, and have accomplished the present invention based on the recognition for the optimum conditions to the arrangement of the permanent magnets made of such different materials.

SUMMARY OF THE INVENTION

The present invention provides a magnetic field generating apparatus for use in MRI in which a pair of permanent magnets each of a trapezoidal section are opposed in parallel with each other in cylindrical yokes with a predetermined gap being defined between each of pole faces, and permanent magnets each of a triangular section are disposed in adjacent with both sides of the permanent magnets each of the trapezoidal section, such that a magnetic field space having a hexagonal section in the direction perpendicular to the longitudinal direction is defined by the magnetic faces of the permanent magnets each of the trapezoidal section and the magnetic faces of the permanent magnets each of the triangular section, wherein the permanent magnets each of the trapezoidal section are made of a rare earth system permanent magnet and the direction of magnetization thereof is identical with the direction of the magnetic field in the magnetic field space, while the permanent magnets each of the triangular section are made of a ferrite system permanent magnet and the direction of magnetization thereof is at a 90° direction relative to the counterfaces to the magnetic field space, and an extreme end at an abutting face of the permanent magnets each of the trapezoidal section against the yoke corresponds with an extreme end at an abutting face of the permanent magnet of the triangular section against the yoke.

In accordance with another aspect of the present invention, there is also provided a magnetic field generating apparatus for use in MRI in which a pair of permanent magnets each of a trapezoidal section are opposed in parallel with each other in cylindrical yoke with a predetermined gap being defined between each of pole faces, and permanent magnets each of a triangular section are disposed in adjacent with both sides of the permanent magnets each of the trapezoidal section, such that a magnetic field space having a hexagonal section in the direction perpendicular to the longitudinal direction is defined by the magnetic faces of the permanent magnets each of the trapezoidal section and the magnetic faces of the permanent magnets each of the triangular section, wherein the permanent magnets each of the trapezoidal section are made of rare earth system permanent magnets and the direction of magnetization thereof is identical with the direction of the magnetic field in the magnetic field space, while the permanent magnets each of the triangular section are made of ferrite system permanent magnets and the direction of magnetization thereof is at 90° direction within a range of less than 90° relative to the counterfaces to the magnetic field space, a space of a triangular section is formed at an adjacent portion between the permanent magnet of the trapezoidal section and the permanent magnet of the triangular section, and an extreme end at an abutting face of the permanent magnets each of the trapezoidal section against the yoke is situated to the outside of a crossing position between a line that extends from an extreme end at an abutting face of the permanent magnet of the triangular section against the yoke transversing the space of the triangular section and the abutting face of the permanent magnet of the trapezoidal section against the yoke.

Further, as a preferred embodiment of each of the magnetic field generating apparatus for use in MRI, there is provided a magnetic field generating apparatus for use in MRI in which a pole piece is disposed to each of counterfaces of a pair of permanent magnets each of the trapezoidal section to the magnetic field space.

In the present invention, the rare earth system magnet constituting the permanent magnets each of the trapezoidal section (hereinafter also referred to simply as trapezoidal permanent magnet) preferably comprises known anisotropic rare earth system permanent magnets having large maximum energy product ((BH)max) (for example, greater than 30 MGOe, preferably, greater than 40 MGOe) such as a rare earth cobalt system permanent magnet and an Fe—B—R system permanent magnet.

Further, the ferrite system permanent magnet constituting the permanent magnets each of the triangular section (hereinafter also referred to simply as triangular permanent magnet) preferably comprises known anisotropic ferrite system permanent magnets which are inexpensive and has relatively large maximum energy product ((BH)max) (for example, greater than 3 MGOe, preferably, greater than 4 MGOe) such as a strontium ferrite magnet and a barium ferrite magnet.

The permanent magnet of a trapezoidal section and the permanent manget of a triangular section made of each of the materials described above are integrated by laminating a plurality of permanent magnet blocks and it is desirable to align the anisotropic direction for each of the permanent magnet blocks with the direction of magnetization of the trapezoidal permanent magnets and the triangular permanent magnets to be described later.

Further, the trapezoidal permanent magnets and the triangular permanent magnets are shown by their configuration in the cross section perpendicular to the longitudinal direction respectively. However, both of them are not restricted only to complete trapezoidal and triangular configurations but the advantageous effect of the present invention is not diminished even if there is some change of configuration such as change of the shape of the pole piece abutting portion caused by the arrangement of the pole pieces and change of shape for each of the permanent blocks caused by the way of lamination, providing that the entire constitution comprises a generally trapezoidal or triangular shape.

Since the optimum shape of the cylindrical yokes having each of the permanent magnets disposed to the inner circumferential surface thereof changes in accordance with the direction of magnetization of each of the permanent magnets as shown in the preferred embodiment to be described later, it is necessary to select the shape of the permanent magnet abutting face in accordance with the shape thereof.

It is desirable that the shape and size are determined within such a range as magnetic fluxes generated from each of the permanent magnets are not saturated in the yokes and it is effective, in the industrial scale production, to adopt a constitution of combining a plurality of yokes to finally integrating them considering workability or the like. Also, referring to the material, eddy currents generated in the yokes can be reduced by using laminates, for example, of silicon steel plates in addition to the soft magnetic materials such as pure iron and iron alloy.

It is also possible to dispose a pole piece to each of the magnetic field space counterfaces of a pair of trapezoidal permanent magnets as required, and the pole piece can improve the uniformity of the magnetic field in the magnetic field space. In addition, while the trapezoidal permanent magnet comprises the rare earth system permanent magnet having a relatively low electric resistance and tending to generate eddy current, the eddy current can be reduced by adopting such a constitution that a material of a relatively high electric resistance such as a laminate of silicon steel plates or soft ferrite is arranged at least to the magnetic field space counterfaces of the pole piece, thereby enabling to prevent undesired effects on gradient magnetic field waveforms caused by eddy currents generated in a magnetic circuit when a pulse current is supplied to gradient magnetic field coils.

The operation of the MRI magnetic field generating apparatus according to the present invention will be explained in details by way of preferred embodiments shown in FIG. 1 to FIG. 6. Each of the figures is an explanatory view for the vertical or longitudinal cross section of the magnetic field generating apparatus reduced in ¼ scale.

In the MRI magnetic field generating apparatus of the present invention, rare earth system permanent magnets having a large maximum energy product ((BH)max) are disposed in a portion of a long gap length, while ferrite system permanent magnets having a small maximum energy product ((BH)max) are disposed in a portion of a short gap length, considering the magnetic characteristics of each of the permanent magnets as a basic constitution.

Specifically, a pair of the trapezoidal permanent magnets opposed in parallel with each other with a predetermined gap being defined between each of the pole piece faces are constituted with the rare earth system permanent magnet, while the triangular permanent magnets disposed in adjacent on both sides of the trapezoidal permanent magnets are constituted with the ferrite system permanent magnet.

Further, in each of the constitutions, the direction of magnetization of the trapezoidal permanent magnets made of the rare earth system permanent magnet is made identical with the direction of magnetic field in the magnetic field space.

BRIEF DESCRIPTION OF THE INVENTION

Figure 4A:
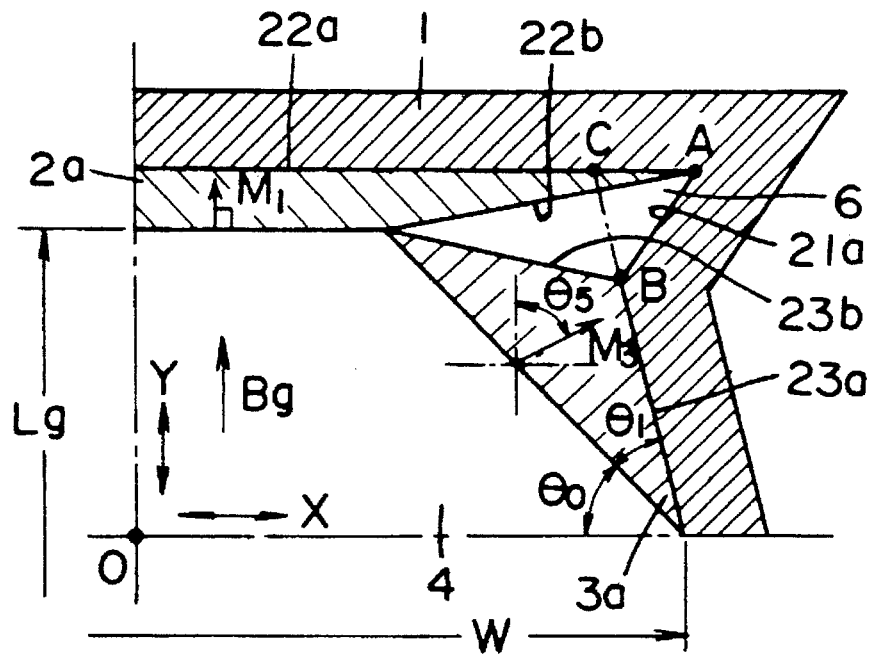

FIG. 4(A) is a longitudinal cross sectional view reduced in ¼ scale illustrating a still further embodiment of a magnetic field generating apparatus for use in MRI according to the present invention and (B) is an explanatory view reduced in ¼ scale illustrating an angular relationship between the direction of magnetization of the triangular permanent magnet and a counterface with the magnetic field space.

Figure 5:
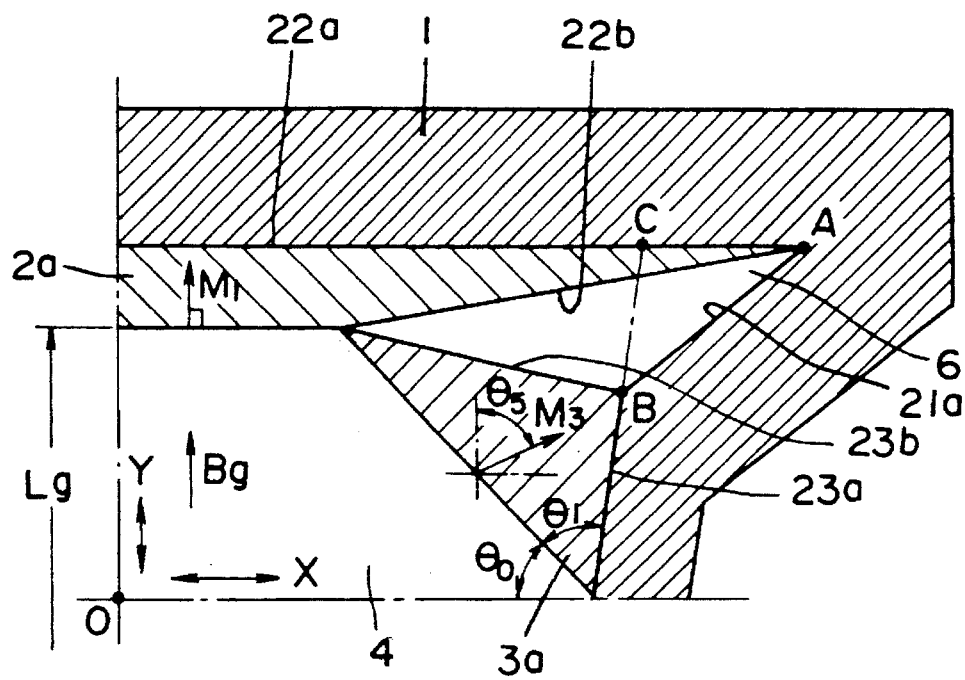

FIG. 5 is a longitudinal cross sectional view reduced in ¼ scale illustrating a further embodiment of a magnetic field generating apparatus for use in MRI according to the present invention.

Figure 6:
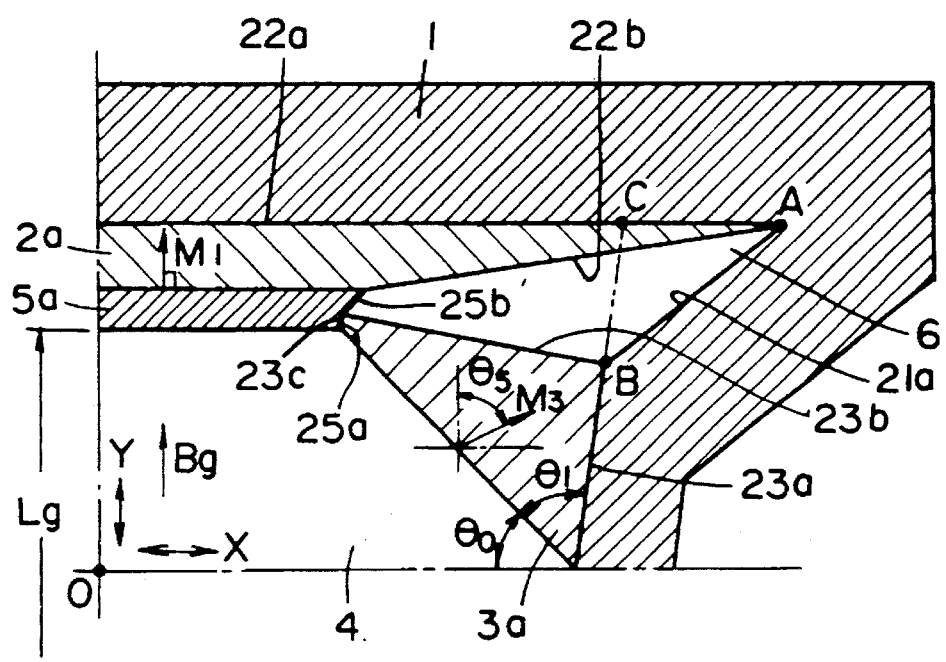

FIG. 6 is a longitudinal cross sectional view reduced in ¼ scale illustrating a further embodiment of a magnetic field generating apparatus for use in MRI according to the present invention.

Figure 7:
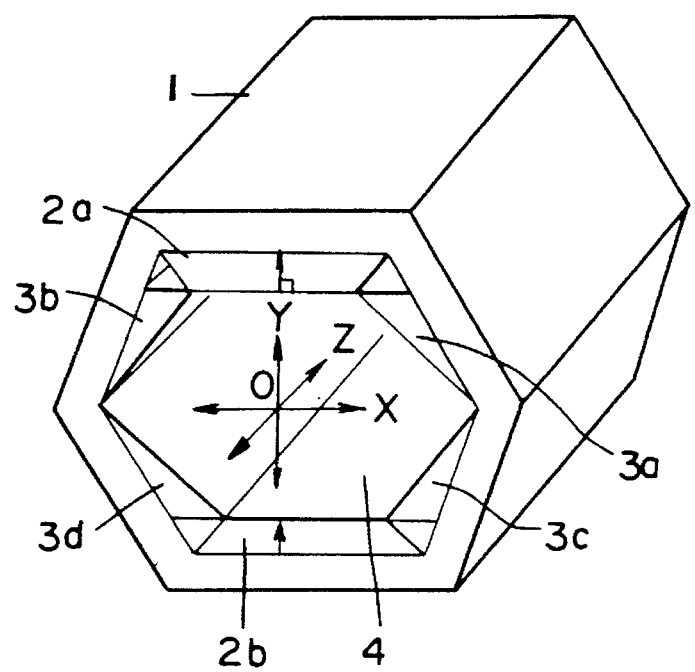

FIG. 7 is a perspective view and a longitudinal view illustrating a magnetic field generating apparatus for use in MRI in the prior art.

Figure 8:
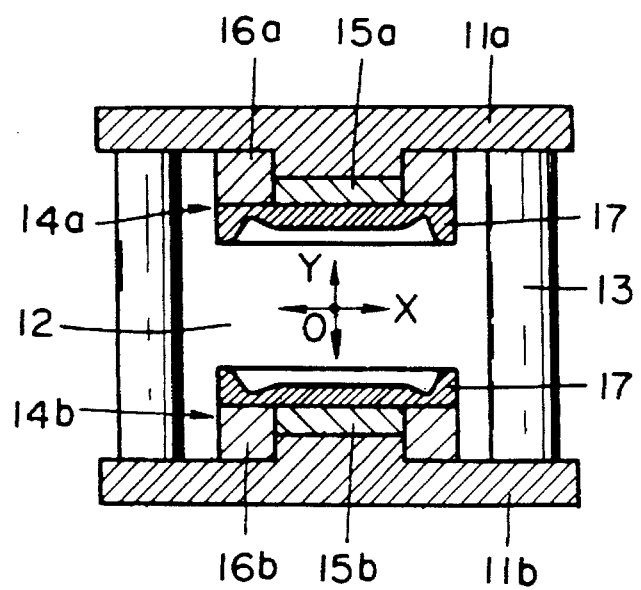

FIG. 8 is a perspective view and a longitudinal view illustrating a magnetic field generating apparatus for use in MRI in the prior art.

Figure 9:
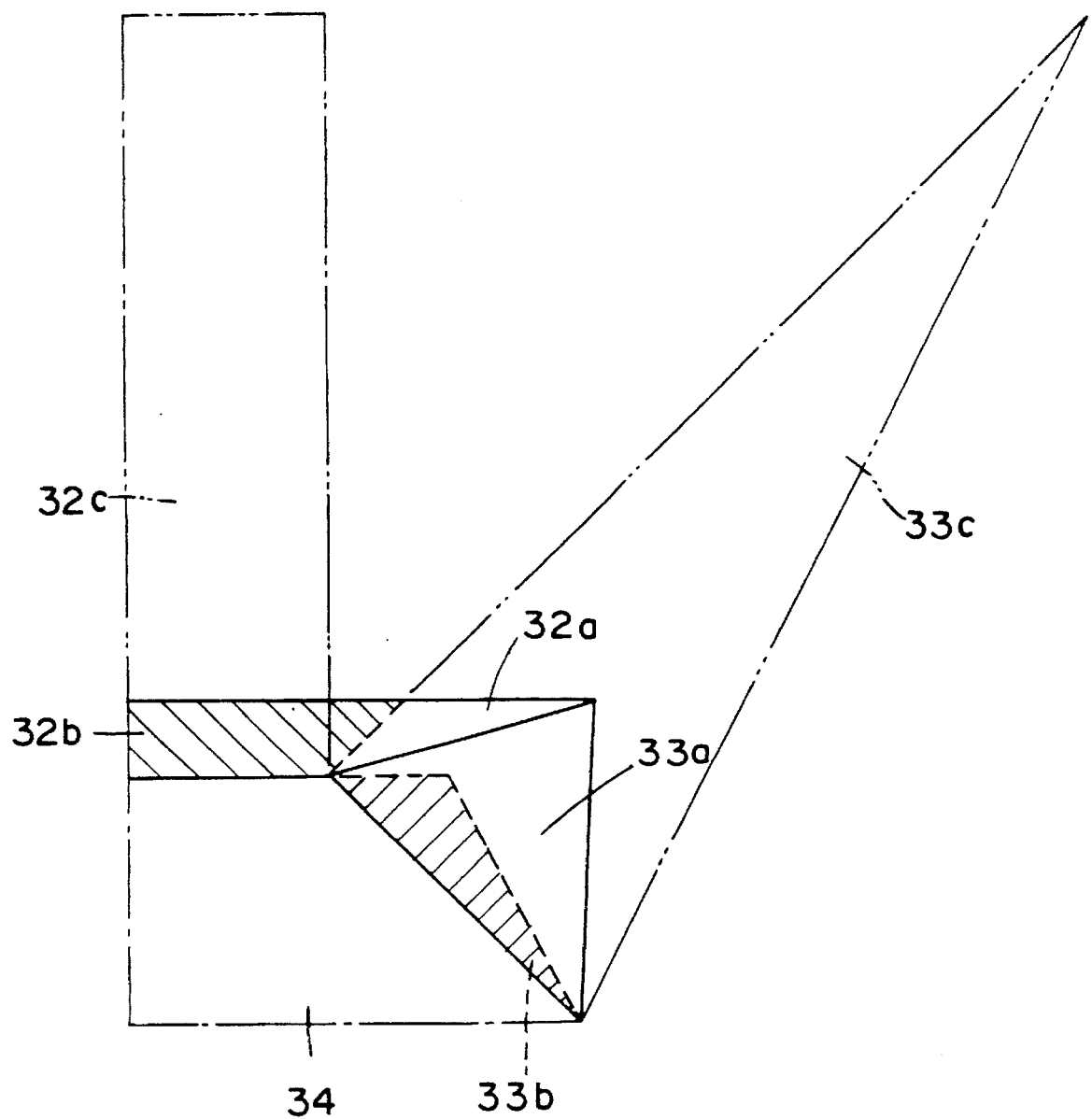

FIG. 9 is a view schematically showing a difference of magnet volume in the magnet constitutions between the magnetic field generating apparatus for use in MRI according to the present invention and the prior art.

DESCRIPTION OF THE PREFERRED EMBODIMENTS

In the following descriptions, explanation will be made specifically in order to make the feature of the present invention clearer to the arrangement of each of the permanent magnets in a case in which the configuration of the magnetic field space is made constant to satisfy the foregoing constitution, and the magnetic field intensity in a central portion of the magnetic field space is changed. Further, the configuration of the magnetic field space is defined as: height (gas length Lg)=650 mm., width (W)=1170 mm., and angle ($\theta_0$) defined between the counter face of the triangular permanent magnet to the magnetic field space and a direction (X) in perpendicular to the magnetic field direction (Y) in the magnetic field space as 45° (refer to FIG. 1).

Figure 1:
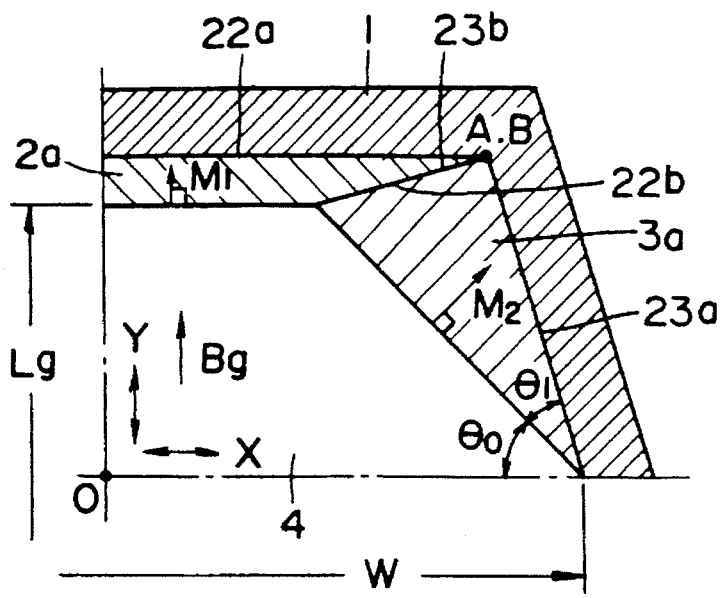
FIG. 1 is a longitudinal cross sectional view reduced in ¼ scale illustrating one embodiment of a magnetic field generating apparatus for use in MRI according to the present invention.
Figure 2:
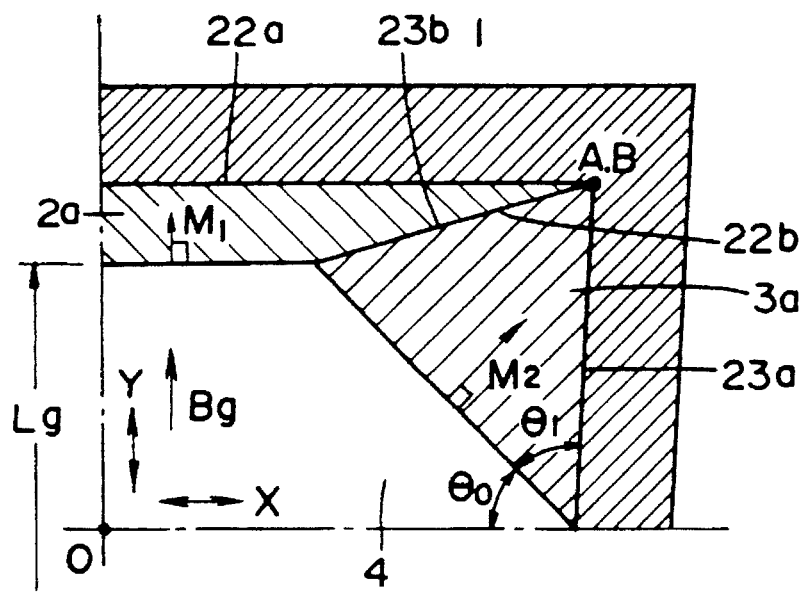
FIG. 2 is a longitudinal cross sectional view reduced in ¼ scale illustrating another embodiment of a magnetic field generating apparatus for use in MRI according to the present invention.
Figure 3:
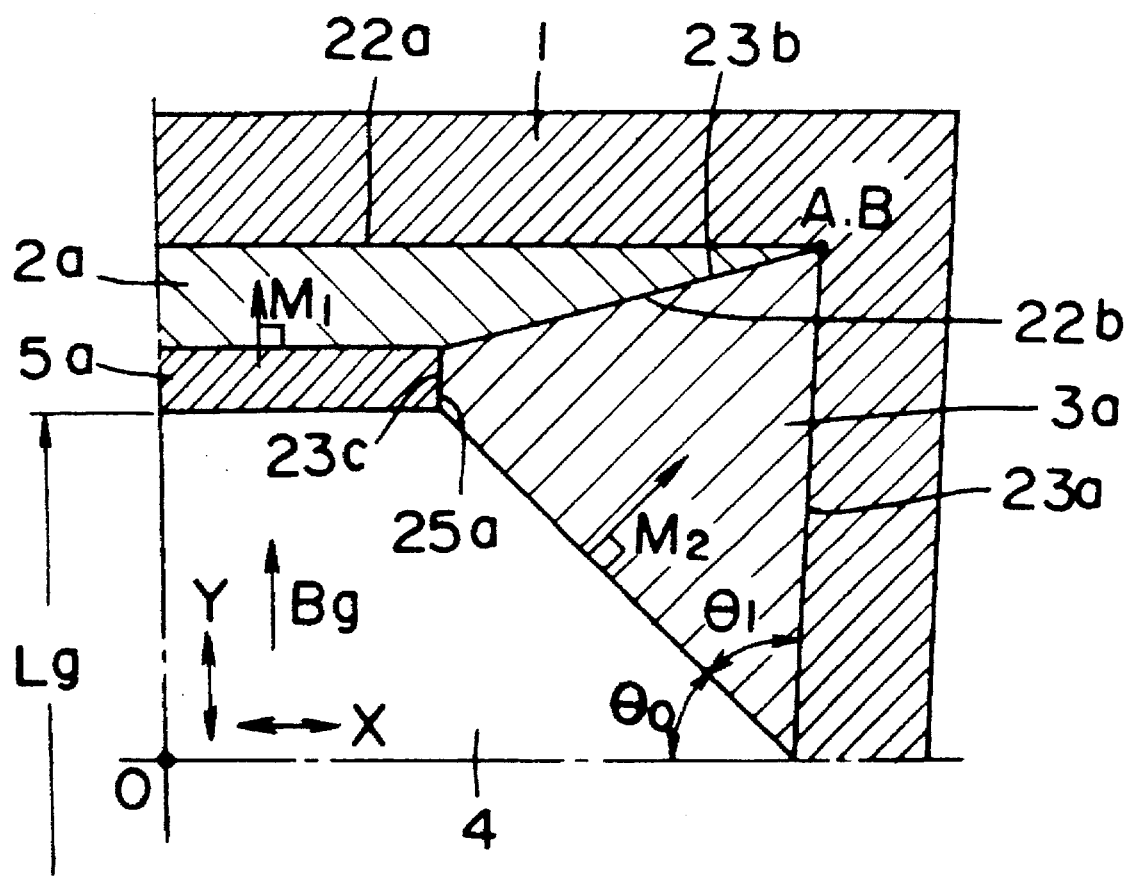
FIG. 3 is a longitudinal cross sectional view reduced in ¼ scale illustrating a further embodiment of a magnetic field generating apparatus for use in MRI according to the present invention.

The constitutions shown in FIG. 1 to FIG. 3 illustrate a constitution in which the direction of magnetization of the triangular permanent magnet made of ferrite system permanent magnet is at a 90° direction (perpendicular direction) relative to the counter face to the magnetic field space and, in particular, FIG. 1 shows a constitution that the magnetic field intensity in a central portion of the magnetic field space is 0.2 T (2000 G), FIG. 2 shows a constitution that the magnetic field intensity in a central portion of the magnetic field space is 0.3 T (3000 G) and, further, FIG. 3 shows a constitution in which the pole pieces are disposed under the condition of FIG. 2.

In FIG. 1, are shown cylindrical yokes 1, a trapezoidal permanent magnet 2a made of a rare earth system permanent magnet, a triangular permanent magnet 3a made of a ferrite system permanent magnet and a magnetic field space 4.

As described previously, each of directions of magnetization $M_1$, $M_2$ of the permanent magnets 2a, 3a is such that the direction of magnetization $M_1$ of the trapezoidal permanent magnet 2a made of the rare earth system permanent magnet is identical with the direction of the magnetic field in the magnetic field space (direction Y in the drawing: In the illustrated embodiment, the polarity of the pole face of each of the permanent magnets is so determined that magnetic fluxes direct upwardly as shown by an arrow Bg), and the direction of magnetization $M_2$ of the triangular permanent magnet 3a made of the ferrite system permanent magnet is at a 90° direction (perpendicular direction) relative to the counter face to the magnetic field space.

In this embodiment, an extreme end (point A in the drawing) at a yoke abutting face 22a of the trapezoidal permanent magnet 2a corresponds with an extreme end (point B in the drawing) at a yoke abutting face 23a of the triangular permanent magnet 3a. Adjacent faces 22b and 23b of the trapezoidal permanent magnet 2a and the triangular permanent magnet 3a abut against each other with no substantial gap.

In FIG. 2, are shown cylindrical yokes 1, a trapezoidal permanent magnet 2a made of a rare earth system permanent magnet, and a triangular permanent magnet 3a made of a ferrite system permanent magnet, in which each of directions of magnetization $M_1$, $M_2$ of the permanent magnets 2a, 3a are the same as the constituion of FIG. 1.

However, since the magnetic field intensity in a central portion of the magnetic field space is increased in the constitution of FIG. 2 as compared with that in FIG. 1, the volume of each of the permanent magnets 2a, 3a is increased, and an angle ($\theta_1$) between a yoke abutting face 23a of the triangular permanent magnet and the counterface to the magnetic field space is increased.

Also in the constitution of FIG. 2, like that in FIG. 1, 1, an extreme end (point A in the drawing) at a yoke abutting face 22a of the trapezoidal permanent magnet 2a corresponds with an extreme end (point B in the drawing) at the yoke abutting face 23a of the triangular permanent magnet 3a, and adjacent faces 22b and 23b of the trapezoidal permanent magnet 2a and the triangular permanent magnet 3a abut against each other with no substantial gap.

Further, for increasing the magnetic field intensity in a central portion of the magnetic field space, the volume of each of the permanent magnets 2a, 3a is increased, and an angle ($\theta_1$) between the yoke abutting face 23a of the triangular permanent magnet and the counter face to the magnetic field space is increased more as compared with the constitution shown in FIG. 2. The purpose of the present invention can be attained when the extreme end (point A in the drawing) at the yoke abutting face 22a of the trapezoidal permanent magnet 2a with the extreme end (point B in the drawing) at the yoke abutting face 23a of the triangular permanent magnet 3a.

FIG. 3 shows embodiment in which a pole piece 5a is disclosed additionally to the constitution shown in FIG. 2 in which the shape and the arrangement of a trapezoidal permanent magnet 2a, a permanent magnet of a generally triangular section 3a and cylindrical yokes 1 are substantially identical with those in the constitution of FIG. 2. In particular, the effect of disposing the pole piece can be utilized most effectively by making each of abutting faces 25a, 23c between the pole piece 5a the permanent magnet of a generally triangular section 3a in parallel with a yoke abutting face 23a of the generally triangular permanent magnet 3a.

FIG. 4 to FIG. 6 show constitutions in which the direction of magnetization of a triangular permanent magnet made of a ferrite system permanent magnet is within a range of less than 90° relative to the counter face to the magnetic field space and less than 90° relative to the magnetic field direction in the magnetic field space and, particularly, FIG. 4 illustrates a structure in which the magnetic field intensity in a central portion of the magnetic field space is 0.2 T (2000 G), FIG. 5 illustrates a structure in which the magnetic field intensity in a central portion of the magnetic field space is 0.3 T (3000 G) and, further, FIG. 6 shows a structure in which a pole piece is disposed under the same conditions as in FIG. 5.

In FIG. 4, are shown cylindrical yokes 1, a trapezoidal permanent magnet 2a made of a rare earth system permanent magnet, a triangular permanent magnet 3a made of a ferrite system permanent magnet and a magnetic field space 4.

As has been described previously, each of the directions of magnetization $M_1$, $M_3$ of the permanent magnets 2a, 3a is such that the direction of magnetization $M_1$ of the trapezoidal permanent magnet 2a made of the rare earth system permanent magnet is identical with the direction of the magnetic field in the magnetic field space (direction Y in the drawing), and the direction of magnetization $M_3$ of the triangular permanent magnet 3a made of the ferrite system permanent magnet is within a range of less than 90° relative to the outer face to the magnetic field space and less than 90° relative to the direction of the magnetic field in the magnetic field space.

Figure 4B:
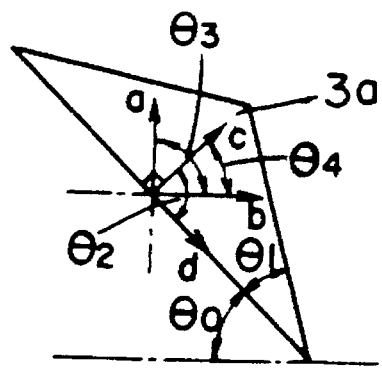

Referring more specifically to the direction of magnetization $M_3$ of the triangular permanent magnet 3a made of the ferrite system permanent magnet with reference to FIG. 4(B), the range of less than 90° relative to the counter face to the magnetic field space is a range indicated by $\theta_3$ from a direction of an arrow (c) to the direction of an arrow (d) in the drawing, while the range of less than 90° relative to the direction of the magnetic field in the magnetic field space is a range indicated by $\theta_2$ from the direction shown by an arrow (a) and to the direction shown by an arrow (b) in the drawing. For attaining the object of the present invention, it is necessary that the direction of magnetization is present within a range indicated by $\theta_4$ from the direction shown by the arrow (c) to the direction shown by the arrow (b) in the drawing which is an overlap portion of the above-mentioned ranges. In this embodiment, a constitution shown by the arrow (c) is identical with the constitution shown in FIG. 1 to FIG. 3, while the constitution shown by the arrow (b) is not included within the scope of the present invention.

FIG. 4 to FIG. 6 show constitutions in which a ferrite system permanent magnet having a direction of magnetization $M_3$ at a 67.5° direction relative to a counterface to the magnetic field space, that is, at a 67.5° direction ($\theta_5$=67.5° in the drawing) also relative to the direction of the magnetic field in the magnetic field space is disposed.

In this embodiment, adjacent faces 22b and 23b of the trapezoidal permanent magnet 2a and the triangular permanent 3a are opposed to each other with a triangular space 6 being formed therebetween. Further, in order to attain the object of the present invention, it is necessary that an extreme end (point A in the drawing) at a yoke abutting face 22a of the trapezoidal permanent magnet 2a situates outside of a crossing position (point C in the drawing) from an extreme end (point B in the drawing) at a yoke abutting face 23a of the triangular permanent magnet 3a along the yoke abutting face 23a transversing a space of a trigonal section 6 and the yoke abutting face 22a of the trapezoidal permanent 2a.

In FIG. 5, are shown cylindrical yokes 1, a trapezoidal permanent magnet 2a made of a rare earth system permanent magnet and a triangular permanent magnet 3a made of a ferrite system permanent magnet, in which the direction of magnetizations $M_1$, $M_3$ of each of the permanent magnets 2a, 3a are identical with the constitution shown in FIG. 4.

However, since the magnetic field intensity in a central portion of the magnetic field space is increased in the constitution of FIG. 5 as compared with that in FIG. 4, the volume of each of the permanent magnets 2a, 3a is increased, and an angle ($\theta_1$) between a yoke abutting face 23a of the trigonal permanent magnet and the counterface to the magnetic field space is increased.

Also in the constitution of FIG. 5, like that in FIG. 4, an extreme end (point A in the drawing) at the yoke abutting face 22a of the trapezoidal permanent magnet 2a is situated to the outside of a crossing point (point C in the drawing) between a line that extends from an extreme end (point D in the drawing) at the yoke abutting face 23a of the triangular permanent magnet 3a along the yoke abutting face 23a transversing a trigonal space 6 and the yoke abutting face 22a of the trapezoidal permanent magnet 2a.

Further, in order to increase the magnetic field intensity at a central portion of the magnetic field space, the volume for each of the permanent magnets 2a, 3a is increased and an angle ($\theta_1$) between the yoke abutting face 23a of the triangular permanent magnet and a counterface of the magnetic field space is increased. However, the object of the present invention can be attained when the extreme end (point A in the drawing) at the yoke abutting face 22a of the trapezoidal permanent magnet 2a is situated to the outside of a crossing point (point C in the drawing) between a line extending from the extreme end (point B in the drawing) at the yoke abutting face 23a of the triangular permanent magnet 3a along the yoke abutting space 23a transversing the space 6 and the yoke abutting face 22a of the trapezoidal permanent magnet 2a.

FIG. 6 shows a constitution in which a pole piece 5a is disposed additionally to the constitution of FIG. 5, in which the shape and the arrangement of a trapezoidal permanent magnet 2a, a permanent magnet of a generally triangular section 3a and cylindrical yokes 1 are substantially identical with those in FIG. 5. Particularly, the effect of disposing the pole piece can be utilized most effectively by making each of abutting faces 25a, 23c between the pole piece 5a and the permanent magnet of a generally triangular section 3a in parallel with yoke abutting surface 23a of the permanent magnet of a generally triangular section 3a, as well as making a counter face 25b of the pole piece 5a to a generally triangular space 6 in parallel with the counter face 21a of the yokes 1 to the generally triangular space 6. That is, the pole pieces can be arranged without disturbing the magnetic field distribution of the magnetic field.

In FIG. 4 to FIG. 6, explanation has been made to a case where the direction of magnetization $M_3$ of the ferrite system section of the triangular permanent magnet is at a 67.5° direction relative to the direction of the magnetic field in the magnetic field space. As the angle is made smaller, an extreme end (point A in the drawing) at the yoke abutting face 22a of the trapezoidal permanent magnet 2a moves inwardly, an extreme end (point B in the drawing) at the yoke abutting face 23a of the triangular permanent magnet 3a moves in a direction extending along the yoke abutting face 23a and, as a result, the position (point C in the drawing) at the yoke abutting face 22a of the trapezoidal permanent manget 2a and the point A are made closer, and in a particular case where the direction of magnetization $M_3$ is at a 45° direction relative to the direction of the magnetic field in the magnetic field space (that is at 90° relative to the counter face to the magnetic field space), the point A and the point C (point B) are aligned with each other without forming the triangular space 6.

Further, when the direction of magnetization $M_3$ of the triangular permanent magnet is decreased toward the direction of the magnetic field In the magnetic field space, that is, it exceeds 90° relative to the counter face to the magnetic field space, it has been confirmed that no aimed MRI magnetic field generating apparatus can be obtained because uniform magnetic field can not be obtained.

Further, when the direction of the magnetization $M_3$ of the triangular permanent magnet is set at a 90° direction relative to the direction of the magnetic field in the magnetic field space (direction X in the drawing), the point A moves to the outer side greatly (substantially infinitely), and it has been confirmed that no aimed MRI magnetic field generating apparatus can be obtained.

Description has been made for each of the constitutions shown in FIG. 1 to FIG. 6, to a case of setting an angle ($\theta_0$) between the counter face of the triangular permanent magnet to the magnetic field space and a direction (direction X) in perpendicular to the direction of the magnetic field (direction Y) in the magnetic field space, but the angle may also be adjusted depending on the required extent of the magnetic field space. It has been confirmed according to the experiment of the inventor that it is desirable to set the angle ($\theta_0$) within a range of 44°5° and, further, in the thus determined constitution that a most magnetically efficient and inexpensive MRI magnetic field generating apparatus can be attained in a case where the direction of magnetization of the triangular ferrite system permanent magnet is 90° relative to the counter face to the magnet field space (constitution shown in FIG. 1 to FIG. 3).

As has been described above, in the present invention, it is possible to provide a magnetic field generating apparatus for use in MRI which is magnetically efficient, decreased in the size of the magnetic field generating apparatus and capable of attaining a reduced cost, by setting the directions of magnetization of the rare earth system permanent magnets and the ferrite system permanent magnets relative to the magnetic field direction within a predetermined range in the magnetic field space formed to the MRI magnetic field generating apparatus and disposing each of the permanent magnets under predetermined constitutions.

(EXAMPLE)

The effect of the present invention is made clearer for one embodiment of the MRI magnetic field generating apparatus according to the present invention shown in FIG. 1 to FIG. 6 and the MRI magnetic field generating apparatus in the prior art shown in FIG. 7, by making the shape of the magnetic field space identical, and comparing the weight of the magnets used while setting the uniformity of the magnetic field as 50 ppm in a spherical space of 200 mm radius in the central portion of each of the magnetic field spaces weight of the magnets in the table is indicated by the magnet weight per 1 m in the longitudinal direction (direction Z).

As described previously, the configuration of the magnetic field space is determined such that height (gap length Lg) is 650 mm, width (W) is 1170 mm and angle ($\theta_0$) between the counter face of the triangular permanent magnet to the magnetic field space and the direction (direction X) perpendicular to the direction of the magnetic field (direction Y) in the magnetic field space is 45°.

Further, the rare earth system permanent magnet used was an Fe—B—R system permanent magnet having a maximum energy product ((BH)max) of 41.6 MGOe, while the ferrite system permanent magnet used was a strontium ferrite system permanent magnet having a maximum energy product ((BH)max) of 4 MGOe.

TABLE 1

| | Presence or absence of pole piece | Magnet | Weight of magnet (ton/m) | |
|---|---|---|---|---|
| | | | Magnetic field intensity = 0.2 T | Magnetic field Intensity = 0.3 T |
| Present Invention 1 | Absence | Rare earth type permanent magnet and ferrite magnet | 1.52 (0.656) Corresponding to FIG. 1 | 2.72 (1.29) Corresponding to FIG. 2 |
| | Presence | Rare earth type permanent magnet and ferrite magnet | — | 3.10 (1.30) Corresponding to FIG. 3 |
| Present Invention 2 | Absence | Rere earth type permanent magnet and ferrite magnet | 1.43 (0.786) Corresponding to FIG. 4 | 2.52 (1.64) Corresponding to FIG. 5 |
| | Presence | Rere earth type permanent magnet and ferrite magnet | — | 2.66 (1.69) Corresponding to FIG. 6 |
| Comparative Example | Absence | Rere earth type permanent magnet and ferrite magnet | (0.91) Corresponding to FIG. 7 | (1.65) Corresponding to FIG. 7 |
| | Presence | Rere earth type permanent magnet and ferrite magnet | — | (1.73) |
| Comparative Example | Absence | Ferrite magnet permanent magnet | 3.72 | 5.03 |

Each of numerals in ( ) represents the weight of the rare earth permanent magnet based on the total weight of the magnet It is apparent from Table 1 that the amount of the rare earth system permanent magnet used can be reduced in the magnetic field generating apparatus for use in MRI according to the present invention and, more in particular, it can be confirmed that the direction of magnetization of the triangular permanent magnet is in the direction within a range of less than 90° relative to the direction of the magnetic field in the magnetic field space, and it can be confirmed that the effect is increased more as the angle is made smaller and set in the vicinity of 90° relative to the counter face to the magnetic field space.

Table 1 shows a difference in the weight of the magnets between the present invention and the prior art (Comparative Example) and FIG. 9 schematically shows a difference for the volume of the magnet in a case where the magnetic field intensity is set to 0.3 T in the magnetic field space having the same size and size as those described above.

That is, the magnet constitution of the present invention corresponding to FIG. 2 is shown by solid lines (32a: rare earth system permanent magnet, 33a: ferrite system permanent magnet) the magnet constitution of the prior art corresponding to FIG. 7 using only the rare earth system permanent magnet (32b: rare earth system permanent magnet, 33b: rare earth permanent magnet) is shown by dotted lines and the magnet constitution of the prior art using only the ferrite magnet (32c: ferrite system permanent magnet, 33c: ferrite system permanent magnet) is shown by dotted chains.

It can be seen from FIG. 9 that the magnet constitution of the present invention does not increase the size as compared with the magnet constitution of the prior art (hatched portion in the drawing).

In accordance with the present invention, as apparent from the preferred embodiments, ferrite system permanent magnets can be arranged effectively without substantially increasing the size of a magnetic field generating apparatus, the amount of the rare earth system permanent magnets in the entire magnets can be reduced and the cost for the whole magnetic field generating apparatus for use in MRI can be reduced, as compared with the magnetic field generating apparatus for use in MRI of the prior art using only the rare earth system permanent magnets as the magnetic field generating source.

That is, the present invention provides a magnetic field generating apparatus for use in MRI having an enhanced magnetic efficiency, decreased in the size of the magnetic field generating apparatus and capable of attaining a reduced cost, in which a magnetic field space of a hexagonal cross section surrounded with counterfaces of a plurality of permanent magnets is formed, by effectively arranging permanent magnets comprising different materials such as rare earth system permanent magnets and ferrite system permanent magnets having different maximum energy products ((BHmax).

What is claimed is:

1. A magnetic field generating apparatus for use in MRI, comprising:

yokes;

a pair of first permanent magnets each having a trapezoidal cross-section and opposed in parallel with one another in said yokes with a predetermined gap being defined between each of the pole faces of the first permanent magnets;

a pair of second permanent magnets each having a triangular cross-section adjacent each side of said first permanent magnets and in which a magnetic field space having a hexagonal cross-section perpendicular to the longitudinal direction is defined by the pole faces of said first and second permanent magnets;

said first permanent magnets comprise rare earth permanent magnets and the direction of magnetization thereof is substantially identical with the direction of the magnetic field in the magnetic field space;

said second permanent magnets comprise ferrite permanent magnets and the direction of magnetization thereof is at a 90 degree direction relative to the counter face of the magnetic field space; and an extreme end at a yoke abutting face of the first permanent magnets corresponds with an extreme end at a yoke abutting face of the second permanent magnets.

2. A magnetic field generating apparatus as defined in claim 1, wherein said pair of first permanent magnets comprise an Re—Fe—B permanent.

3. A magnetic field generating apparatus as defined in claim 1, wherein said pair of first permanent magnets comprise a rare earth cobalt permanent.

4. A magnetic field generating apparatus as defined in claim 1, wherein said yokes comprise a body made of soft magnetic material such as at least one of pure iron and iron alloy.

5. A magnetic field generating apparatus as defined in claim 1, wherein said yokes comprise a laminate of silicon steel plates.

6. A magnetic field generating apparatus as defined in claim 1, wherein a pole piece is disposed to the counterface of said first permanent magnets in the magnetic field space.

7. A magnetic field generating apparatus as defined in claim 6, wherein the counterfaces of said first permanent in the magnetic field space comprise a laminate of silicon steel plates.

8. A magnetic field generating apparatus as defined in claim 6, wherein the counterfaces of the pole pieces in the magnetic field space disposed with respect to the counterfaces of said pair of said first permanent magnets in the magnetic field space comprise soft ferrite.

9. A magnetic field generating apparatus as defined in claim 1, wherein wherein an angle ($\theta_0$) between the counterface of the second permanent magnets to the magnetic field space and perpendicular to the direction of the magnetic field in the magnetic field space is within a range of 40 to 50 degrees.

10. A magnetic field generating apparatus for use in MRI, comprising:

yokes;

a pair of first permanent magnets each having a trapezoidal cross-section and opposed in parallel with each other in said yokes with a predetermined gap being defined between each of the pole faces;

a pair of second permanent magnets each having a triangular cross-section adjacent each side of said first permanent magnets in which a magnetic field space having a hexagonal cross-section perpendicular to the longitudinal direction is defined by the pole faces of the first and second permanent magnets;

the first permanent magnets comprise a rare earth permanent magnet and the direction of magnetization is identical with the direction of the magnetic field in the magnetic field space;

the second permanent magnets comprise a ferrite permanent magnet and the direction of magnetization thereof is at a 90 degree direction relative to the counterface of the magnetic field space;

a gap portion having a triangular section is formed at an adjacent portion between the first and second permanent magnets;

an extreme end at an abutting face of the first permanent magnets against the yoke is situated to the outside of a crossing position between a line extending from an extreme end at the abutting face of the second permanent magnets in the yoke traversing the space of the triangular section and the abutting face of the first permanent magnets in the yoke.

11. A magnetic field generating apparatus as defined in claim 10, wherein said first permanent magnets comprise rare earth cobalt permanent magnets.

12. A magnetic field generating apparatus as defined in claim 10, wherein said first permanent magnets comprise Re—Fe—B permanent magnets.

13. A magnetic field generating apparatus as defined in claim 10, wherein said yokes comprise a bulk body made of soft magnetic material such as at least one of pure iron and iron alloy.

14. A magnetic field generating apparatus as defined in claim 10, wherein said yokes comprise a laminate of silicon steel plates.

15. A magnetic field generating apparatus as defined in claim 10, wherein a pole piece is disposed at each of the counterfaces of a pair of said first permanent magnets to the magnetic field space.

16. A magnetic field generating apparatus as defined in claim 15, wherein the counterface to the magnetic field space of the pole piece disposed to the counterface of a pair of said first permanent magnets to the magnetic field space comprises a laminate of silicon steel plates.

17. A magnetic field generating apparatus as defined in claim 15, wherein the counterface of the pole piece of the magnetic field space disposed to the counter face of a pair of said first permanent magnets to the magnetic field space comprise soft ferrite.

18. A magnetic field generating apparatus as defined in claim 15, wherein an angle ($\theta_0$) between the counter face of the second permanent magnets to the magnetic field space and the direction perpendicular to the direction of the magnetic field in the magnetic field space is within a range of 40 to 50 degrees.

* * * * *